(12) United States Patent
Moon et al.

(10) Patent No.: US 10,437,072 B2
(45) Date of Patent: Oct. 8, 2019

(54) LINE BEAM FORMING DEVICE

(71) Applicant: PHILOPTICS CO., LTD., Gyeonggi-do (KR)

(72) Inventors: Jinbae Moon, Seoul (KR); Hyejung Kim, Gyeonggi-do (KR); Sanggil Ryu, Gyeonggi-do (KR)

(73) Assignee: PHILOPTICS CO., LTD (KR)

( * ) Notice: Subject to any disclaimer, the term of this patent is extended or adjusted under 35 U.S.C. 154(b) by 289 days.

(21) Appl. No.: 15/542,876

(22) PCT Filed: Jun. 19, 2015

(86) PCT No.: PCT/KR2015/006268
§ 371 (c)(1),
(2) Date: Jul. 11, 2017

(87) PCT Pub. No.: WO2016/199971
PCT Pub. Date: Dec. 15, 2016

(65) Prior Publication Data
US 2018/0011330 A1  Jan. 11, 2018

(30) Foreign Application Priority Data
Jun. 10, 2015 (KR) .................. 10-2015-0082119

(51) Int. Cl.
G02B 27/09 (2006.01)
H01S 3/00 (2006.01)
H01S 5/40 (2006.01)

(52) U.S. Cl.
CPC ..... *G02B 27/0977* (2013.01); *G02B 27/0905* (2013.01); *G02B 27/0983* (2013.01);
(Continued)

(58) Field of Classification Search
CPC ............ G02B 27/0905; G02B 27/0977; G02B 27/0983; H01S 3/005
(Continued)

(56) References Cited

U.S. PATENT DOCUMENTS 3,506,334 A * 4/1970 Korpel .................. G02F 1/29
359/317
3,675,985 A * 7/1972 Gloge .................. G01J 11/00
359/328
(Continued)

FOREIGN PATENT DOCUMENTS

JP    2001156371 A    6/2001
KR    100864017 B1   10/2008
(Continued)

OTHER PUBLICATIONS

International Search Report; dated Mar. 9, 2016 for PCT Application No. PCT/KR2015/006268.

*Primary Examiner* — Ricky D Shafer
(74) *Attorney, Agent, or Firm* — Mendelsohn Dunleavy, P.C.

(57) ABSTRACT

Provided is a line beam forming device that can divide a laser beam into beam segments in a first direction (y-axis) perpendicular to the traveling direction (z-axis) of the laser beam, and arrange and emit the beam segments with regular intervals in a second direction (x-axis) perpendicular to the traveling direction of the laser beam, using a single mirror set composed of a plurality of mirrors. The line beam forming device of the present invention can be used for an excimer laser which is a multimode laser beam generator with high beam divergence, a high-power DPSS laser, or a laser diode, can obtain high-density energy by condensing beams, can obtain a beam profile having uniform intensity in both of a long axis and a short axis, and can combine a (Continued)

plurality of laser beams without being influenced by the properties of an incident beam.

17 Claims, 9 Drawing Sheets

(52) U.S. Cl.
CPC ............ *H01S 3/005* (2013.01); *H01S 3/0057* (2013.01); *H01S 5/4012* (2013.01)

(58) Field of Classification Search
USPC ....... 359/627, 629, 631, 633, 839, 857, 858, 359/867; 372/99
See application file for complete search history.

(56) References Cited

U.S. PATENT DOCUMENTS

| | | | | |
|---|---|---|---|---|
| 4,362,361 A | * | 12/1982 | Campbell | G02B 27/144 359/629 |
| 4,765,715 A | * | 8/1988 | Matsudaira | G02B 27/106 359/583 |
| 4,871,232 A | * | 10/1989 | Grinberg | G01R 23/17 359/618 |
| 5,343,489 A | * | 8/1994 | Wangler | G02B 27/09 372/108 |
| 8,599,485 B1 | * | 12/2013 | Cobb | H01S 5/005 359/618 |
| 9,285,544 B2 | * | 3/2016 | Panotopoulos | G02B 6/4231 |
| 2006/0171036 A1 | | 8/2006 | Govorkov et al. | |

FOREIGN PATENT DOCUMENTS

| | | |
|---|---|---|
| KR | 20090008942 A | 1/2009 |
| KR | 101081370 B1 | 11/2011 |

* cited by examiner

5mm x 5mm
(0.5° x 0.5°)
(a)

5mm x 25mm
(0.5° x 0.1°)
(b)

25mm x 5mm
(0.5° x 0.1°)
(c)

LINE BEAM FORMING DEVICE

TECHNICAL FIELD

The present invention relates to a beam forming device and, more particularly, to a beam forming device that can divide a laser beam into beam segments having a predetermined size in a first direction (y-axis) perpendicular to the traveling direction (z-axis) of the laser beam and can arrange and radiate the beam segments with regular intervals in a second direction (x-axis) perpendicular to the traveling direction (z-axis) of the laser beam, using a single mirror set composed of a plurality of mirrors.

BACKGROUND ART

Recently, an excimer laser or a UV DPSS (Diode Pumped Solid State) laser that is a high power UV laser is used in an LLO (Laser Lift Off) process that separates a thin film on a substrate using a laser beam in order to manufacture small devices such as an LED (Light Emitting Diode). Further, an excimer laser or a DPSS laser is used in a process of depositing an amorphous silicon layer and then crystallizing it in order to manufacture an LTPS (Low Temperature Poly Silicon) thin film transistor that is used as a switching device in liquid crystal panels.

In order to ensure a tightly focused and highly resolved beam spot in a process requiring high energy, it is required to reduce the size of the beam spot. Further, the intensity of a beam should be uniformly distributed in the beam for uniform processing.

There has been disclosed in U.S. Pat. No. 7,286,308 a method of exchanging beam qualities of a long axis and a short axis using a prism array to focus light from a laser diode bar. According to the method of U.S. Pat. No. 7,286,308, when a prism array is used, it is difficult to manufacture a precise optical system due to complicated manufacturing, assembling, and arranging, and the size of an optical system is too large, so practicability is low.

Further, U.S. Pat. No. 5,513,201 employs a device that rotates a light path to focus light to an optical fiber in a laser diode array system and proposes a method that uses a lens, a prism, and a mirror to rotate a light path. However, it is still difficult to manufacture a precise optical system due to complicated manufacturing, assembling, and arranging, and the problem that the size of an optical system is too large still remains. In particular, when a cylindrical lens array is used, there is a problem that the larger the focal length, the larger the beam loss. This leads to a focal length being small which causes an optical aberration.

Further, a system that requires a power threshold over a predetermined level has a limit in the maximum output of laser light, so it is required to combine two or more lasers in some cases. Accordingly, there is a need for an optical system that makes a flat top line beam profile that can perform uniform processing throughout the entire area at a time by combing two or more lasers. However, the method disclosed in U.S. Pat. Nos. 7,286,308 or 5,513,201 needs a separate optical system because it is difficult to combine two or more lasers in one optical system.

Further, it is required to construct an optical system that maintains a small spot size in the direction of a short axis (y axis) and has a flat-top profile not only in the direction of a long axis (x axis), but the short axis (y axis) in order to generate a high-density energy line beam and uniformly distribute the intensity of the beam.

DISCLOSURE

Technical Problem

An object of the present invention is to provide a device that allows for reduction of maintenance costs because it can be used regardless of the energy sources of lasers, can be simply manufactured, can reduce a loss of light, can reduce a beam spot size, and can generate a uniform line beam in the directions of a short axis and a long axis.

However, the objects of the present invention are not limited to those described above and other objects may be made apparent to those skilled in the art from the following description.

Technical Solution

In order to achieve the objects, according to an aspect of the present invention, there is provided a line beam forming device for forming a line beam on an operation surface, the device including: a laser source emitting a laser beam; and a single mirror set composed of a plurality of mirrors, in which a single mirror set is disposed in the beam forming device to sequentially emit beam segments having a predetermined size by repeating a process of receiving a laser beam, emitting beam segments having a predetermined size by dividing the laser beam in a first direction (y-axis) perpendicular to a traveling direction (z-axis) of the laser beam, and moving the other beam by a predetermined size in the first direction (y-axis) by reflecting again the other beam in the single mirror set, and to arrange the beam segments with regular intervals in a second direction (x-axis) perpendicular to the traveling direction (z-axis) of the laser beam.

Advantageous Effects

The line beam forming device of the present invention can be used for an excimer laser which is a multimode laser beam with high beam divergence, a high-power DPSS laser, or a laser diode; can obtain high-density energy by condensing beams; can obtain a beam profile having uniform intensity in both of a long axis and a short axis; and can combine a plurality of laser beams without being influenced by the properties of an incident beam.

MODE FOR INVENTION

Figure 1A:
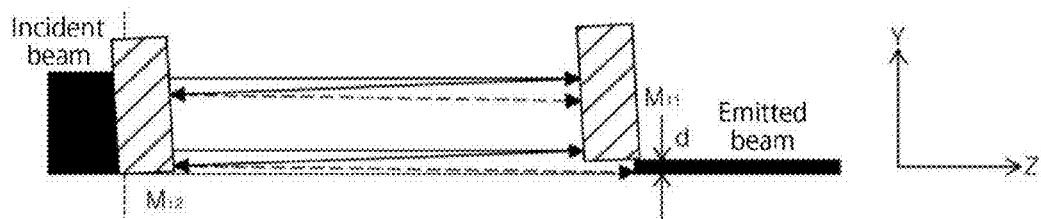
FIG. 1 shows a side view (FIG. 1a) and a plan view (FIG. 1b) schematically showing incidence, reflection, and emission of light in a single mirror set composed of two mirrors according to an embodiment of the present invention.

Embodiments of the present invention will be described in detail with reference to the accompanying drawings for those skilled in the art to easily achieve the present invention. However, as those skilled in the art would realize, the described embodiments may be modified in various different ways, all without departing from the spirit or scope of the present invention. In the accompanying drawings, portions unrelated to the description will be omitted in order to obviously describe the present invention, and similar reference numerals will be used to describe similar portions throughout the present specification.

Through the present specification, unless explicitly described otherwise, "comprising" any components will be understood to imply the inclusion of other components rather than the exclusion of any other components.

Terms "composed of" or "include" used herein should not construed as necessarily including all of various components or various steps, but construed that they may not include some of the components or steps or may further include additional components or steps.

Further, terms including ordinal numbers such as 'first' and 'second' used in the specification may be used to describe other components, but the components should not be construed as being limited to the terms. The terms are used to distinguish one component from another component. For example, the 'first' component may be named the 'second' component, and vice versa, without departing from the scope of the present invention.

The present invention relates to a beam forming device including an optical system that generates a high-density energy line beam using a laser source.

A large characteristic of the optical system is that beam intensity distribution is different in a first direction (y-axis or short axis) and a second direction (x-axis or long axis) that are perpendicular to the traveling direction (z-axis) of the beam. In order to uniformly process a substance, it is required to uniformly distribute a beam density, and for this purpose, it is required to collimate beams into beams having a uniform intensity and a length (5~1500 mm) suitable for the system using a homogenizer in the second direction (x-axis). Further, in order to effectively process a substance, it is required to make a high-density energy line beam, and to this end, it is required to reduce a spot size by concentrating or focusing a beam in the first direction (y-axis).

A laser beam travels in Gaussian type and a spot size is determined as double the beam waist $w_0$. The spot size $2w_0$ of a beam concentrated through a lens is determined by the following Equation (1) on the basis of the relationships of a laser wave length ($\lambda$), the size D of a beam traveling into the lens, the focal length F of the lens, and a beam quality factor $M^2$.

$$2w_0 = \frac{4\lambda F}{\pi D} M^2 \qquad \text{Equation (1)}$$

Referring to Equation (1), the following methods may be considered to reduce the spot size $2w_0$.

The first method is to increase the size D of the beam traveling into the lens. In this case, the size of an optical system is in creased and the aberrations of a lens are also increased, so there is a limit in increasing the beam size D, and accordingly, it is difficult to reduce the spot size to a predetermined level or less.

The second method is to use a lens having a short focal length F. In this case, the aberrations of a lens are increased, so there is a limit in reducing the spot size. Further, the distance between the lens and an object to be processed is short, so the processing is inconvenient.

The third method is to reduce the beam quality factor $M^2$ with the beam size D and the focal length F of a lens maintained. The present invention has been made to overcome the problems that may be caused in the method of changing the beam size D and the focal distance F of a lens by reducing the spot size by decreasing the beam quality factor.

The beam quality factor $M^2$ has a characteristic that it increases with beam divergence $\Theta$. The beam factors $M^2$ and the beam divergences $\Theta$ of a Gaussian $TEM_{00}$ beam ($M^2=1$) and a common laser beam ($M^2>1$) are defined as following Equations (2) and (3).

Gaussian $TEM_\infty$ Beam ($M^2 = 1$): \qquad Equation (2)

$$\Theta = \frac{\lambda}{\pi w_0} \Leftrightarrow BPP = \Theta w_0 = \frac{\lambda}{\pi}$$

Non-perfect Laser Beam with $M^2 > 1$: \qquad Equation (3)

$$\Theta = \frac{M^2 \lambda}{\pi w_0} \Leftrightarrow BPP = \Theta w_0 = \frac{M^2 \lambda}{\pi}$$

Accordingly, by reducing the beam divergence, the beam quality factor can be reduced and the spot size is also reduced, so a high-density energy beam can be obtained.

The beam quality factors $M^2$ of common lasers are 2 or less, but the beam divergences of high power lasers are very large, so the beam quality factor $M^2$ of a high power DPSS laser or an excimer laser is 25 or more, which corresponds to 2 mrad or more beam divergence.

Assuming that the wavelength of a beam is 0.5 μm, the beam size is 5 mm, and the focal length of a focusing lens is 100 mm in a high power laser, the spot size that is focused by the focusing lens is 300 μm or more. As described above, since when a spot size is large, the energy (or power) density is small, and substrates or substances are cannot be processed. A spot size to be focused should be tens of micrometers or several micrometers to obtain high-density energy.

In optical systems using common lenses, it is required to increase the beam size in order to reduce the laser beam divergence in accordance with Etendue conservation law (Etendue=length of optical system×NA of optical system). Accordingly, it is impossible to reduce the beam divergence without changing the beam size of a laser.

Therefore, the present invention has been designed for the intention of discrimination from optical systems using lenses through a method of generating beam segments in a predetermined size by moving a laser beam to a predetermined distance and dividing it by repeatedly reflecting the laser beam using a single mirror set.

To this end, a beam forming device for generating a line beam on an operation surface according to the present invention includes a laser source that emits a laser beam and a single mirror set composed of a plurality of mirror. The single mirror set is disposed in the beam forming device to sequentially send out beam segments having a predetermined size and arrange the beam segments in a second direction (x-axis) perpendicular to the traveling direction (z-axis) of the laser beam, by repeating a process that sends out beam segments having a predetermined size by receiving a laser beam and dividing the beam in a first direction (y-axis) perpendicular to the traveling direction (z-axis) of the laser beam and moves the other beams to a predetermined distance in the first direction (y-axis) by reflecting the other beams therein.

A beam converter is further provided in front of the single mirror set, so it is possible to reduce a beam divergence of the laser beam passing through the beam converter in the first direction (y-axis) by increasing the size of the laser beam in the first direction (y-axis).

The beam converter may be a cylindrical lens set or other optical systems. For example, assuming that the size of a raw beam (FIG. 5a) emitted from a light source is 5 mm in the first direction (y-axis) and the second direction (x-axis) and the beam divergence is 0.5° in the first direction (y-axis) and the second direction (x-axis), the size of the beam (FIG. 5b) that has passed through the beam converter can be increased to 25 mm (5 times) in the first direction (y-axis), but maintained at 5 mm in the second direction (x-axis) and the beam divergence can be reduced to 0.1° (⅕ times) in the first direction (y-axis) and maintained at 0.5° in the second direction (x-axis).

Figure 5:
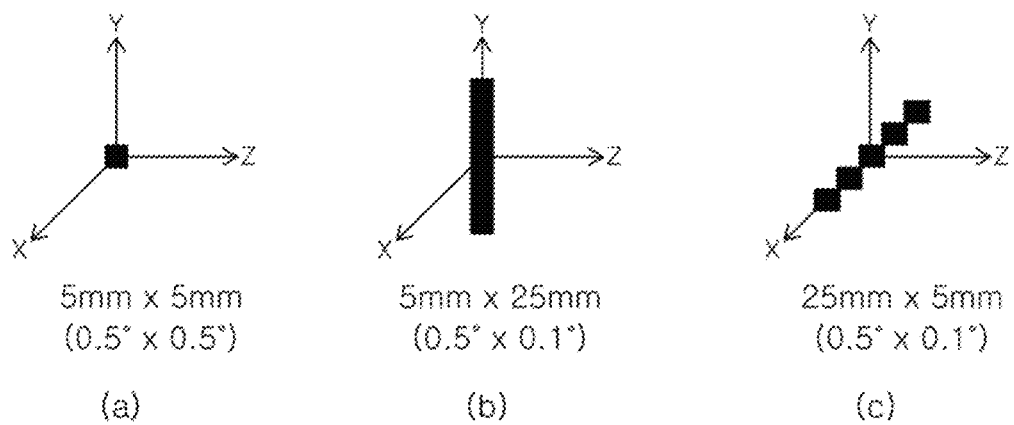
FIG. 5 shows schematic views showing arrangement of beams that have passed through a single mirror set after the sizes of the beams are increased in a first direction (y-axis).

Accordingly, as compared with the laser beam (FIG. 5a) emitted from the light source, the beam traveling into the single mirror set is converted such that the beam size and beam divergence in the second direction (x-axis) are maintained, but the beam size is increased and the beam divergence is reduced in the first direction (y-axis) (FIG. 5b).

As exemplified in FIGS. 1 to 3, the single mirror set includes a first mirror $M_{11}$, $M_{21}$, $M_{31}$ that receives a laser beam horizontally traveling in the first direction (y-axis) (at an incident angle of 0°), passes a beam segment through an emission part, and reflects the other beam and a second mirror $M_{12}$, $M_{23}$, $M_{34}$ that reflects back the beam reflected from the first mirror, in which the first mirror may be spaced from the second mirror in the traveling direction of the laser beam (z-axis) and may be disposed at a different position by the length d of the emission part in the first direction (y-axis). The length of the beam segments in the first direction (y-axis) can be adjusted by adjusting the length d of the emission part.

That is, the length of the emitted beam segment in the first direction (y-axis) can be adjusted by the height difference in the first direction (y-axis) of the first mirror and the second mirror. When the height difference between the first mirror and the second mirror in the first direction (y-axis) is large, the length of the beam segments in the first direction (y-axis) is large, and when the height difference is small, the length in the first direction (y-axis) is small.

The emission part may be a space filled with air. In this case, the beam segment passes through the space.

Figure 6A:
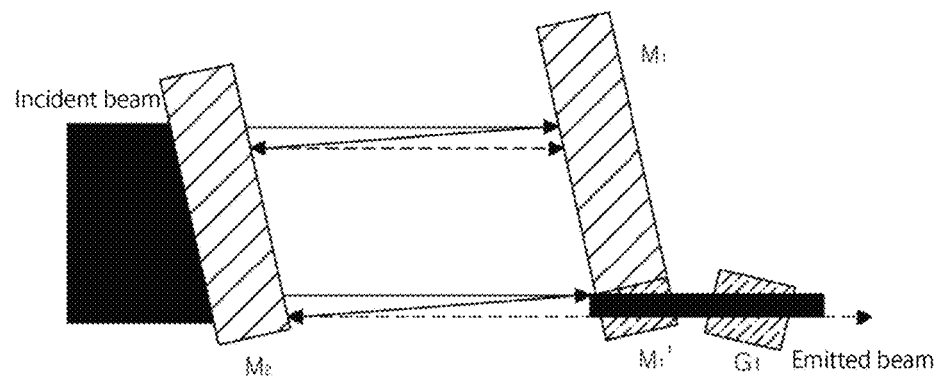
FIGS. 6a and 6b are views showing the configuration of an optical system of which a loss of light is minimized by a nonreflective coating in the path of an emitted beam from a single mirror set in accordance with an embodiment of the present invention.

However, in the single mirror sets shown in FIGS. 1 to 3, a loss of light may be caused by irregular reflection due to fine cracks at the edges of the mirrors or the corners when the beam passes through the passing parts. The following means, which is shown in FIG. 6a, is provided to solve this problem.

That is, the emission part through which a beam passes is not a space filled with air, but is a portion of the mirror at the emission side (that is, the first mirror) and the portion is coated with an AR (anti-reflective) layer that improves the transmissivity of the portion, whereby it is possible to prevent a loss of light at the edge.

Figure 6B:
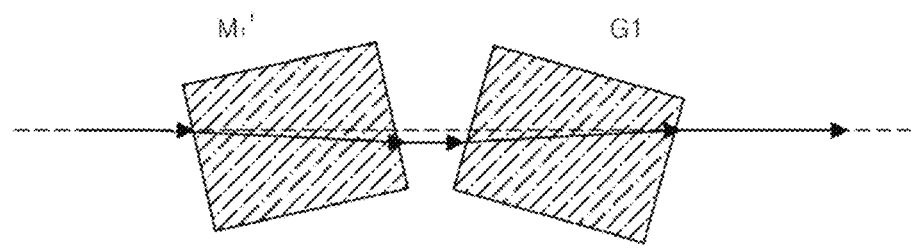

However, as shown in FIG. 6b, when a beam passes through surfaces having different refractive indexes, the beam is refracted in accordance with Snell's law. Accordingly, the exiting beam may be shifted. Accordingly, in order to prevent this problem, a refraction correction member G1 is additionally disposed in the emission path of the beam segments. The refraction correction member G1 is made of the same material as the emission portion $M_1'$ coated with an AR layer with the same thickness and is inclined at the same angle, but in the opposite direction to the emission portion, so the beam can be sent out to the exact position.

Meanwhile, according to the present invention, it is possible to adjust the gaps of beam segments in the second direction (x-axis) and the total length of the beam emitted in the second direction (x-axis) by adjusting the incident angle of the laser beam in the second direction (x-axis) and the angle of the single mirror set. That is, when the angle is increased, the gaps of the beam segments and the total length of the beam in the second direction (x-axis) are increased, and when the angle is decreased, the gaps of the beam segments and the total length of the beam in the second direction (x-axis) are decreased.

The laser beam traveling to the mirrors of the single mirror set travels to the first mirror not at a right angle, but a predetermined angle in the second direction (x-axis), so the beam is shifted by a predetermined distance d, for example, 5 mm in the first direction (y-axis) every time it is reflected or reflected again (one cycle) in the single mirror set, and the beam travels outside through the space having the length d, that is, the emission part, whereby a beam segment having a predetermined size d (for example, 5 mm) in the first direction (y-axis) is generated.

Further, beam segments are arranged with a regular gaps 'w' (for example, 5 mm) in the second direction (x-axis), so the total length is increased to 25 mm. Accordingly, the beam that has passed through the single mirror set is changed from 5 mm (x-axis)×25 mm (y-axis) into 25 mm (x-axis)×5 mm (y-axis), but the beam divergence in the second direction (x-axis) and the first direction (y-axis) is maintained, so the beam divergence in the first direction (y-axis) is 0.1°.

As a result, the beam that has passed through both the beam converter and the signal mirror set, as compared with the raw laser beam, has the same size, but reduces to ⅕ in beam divergence in the first direction (y-axis). Further, it increases in size, but maintains the beam divergence in the second direction.

The beam reflected from the first mirror directly may be sent to the second mirror and reflected back to the first mirror, or may be sent to the second mirror through at least one additional mirror in the single mirror set and reflected back to the first mirror.

Figure 1B:
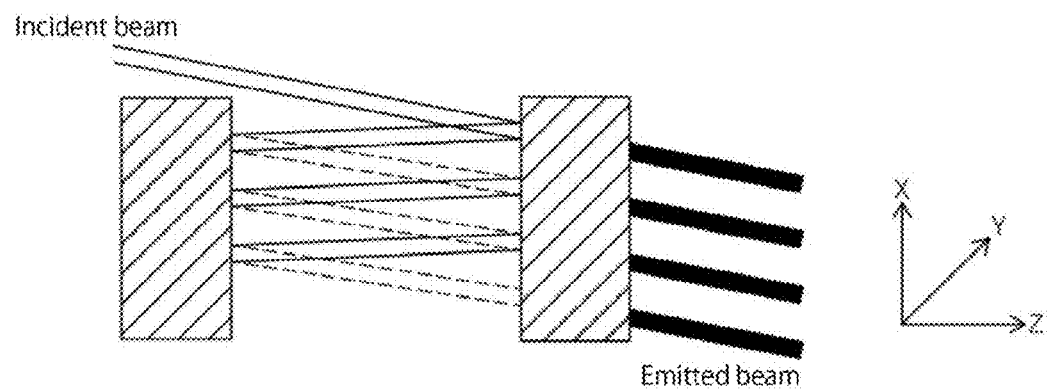

That is, as shown in FIGS. 1a and 1b, when a single mirror set is composed of two mirrors facing each other, a portion of a beam sent to the first mirror travels to the outside as a beam segment and the other beam is reflected from the first mirror, directly sent to the second mirror, and then reflected back to the first mirror, whereby the beam is divided and shifted.

The single mirror set may further include one or more mirrors other than the first mirror and the second mirror.

As shown in FIGS. 2 and 3, when a single mirror set is composed of three or four mirrors by adding one or two mirrors other than the first mirror and the second mirror, a portion of a beam sent to the first mirror is sent out as a beam segment and the other is reflected from the first mirror to the second mirror through the additional mirrors and then reflected back to the first mirror, so the beam is shifted and divided.

Shifting and dividing of a beam in a single mirror set composed of four mirrors are described in detail with reference to FIGS. 3a and 3b.

A beam increased in size and decreased in beam divergence in the first direction (y-axis) through the beam converter is sent to the single mirror set not a right angle, but a predetermined angle in the second direction (x-axis). The beam is shifted by a predetermined distance d (5 mm) every time it is reflected or reflected again (one cycle).

Figure 3A:
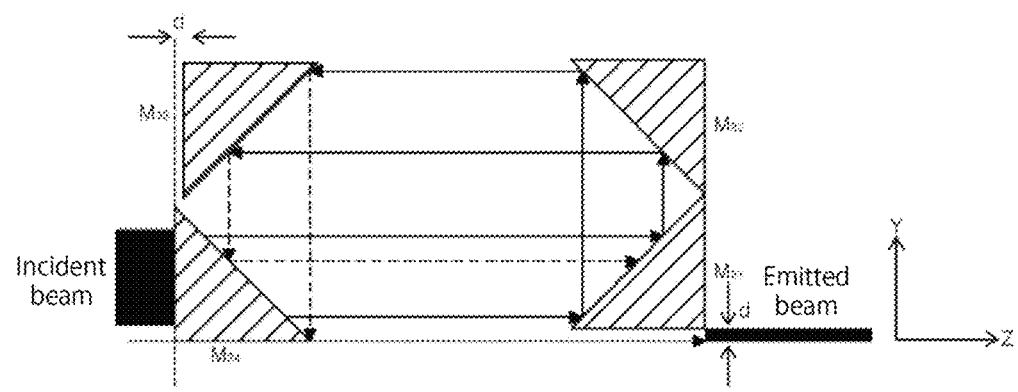
FIG. 3 shows a side view (FIG. 3a) and a plan view (FIG. 3b) showing incidence, reflection, and emission of light in a single mirror set composed of four mirrors according to an embodiment of the present invention.
Figure 3B:
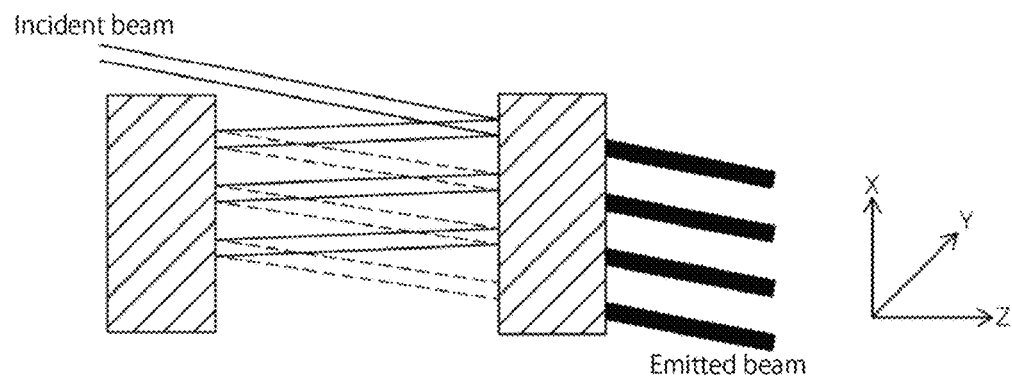

Further, when the mirrors $M_{33}$ and $M_{34}$ are arranged to each have a space d (5 mm) in the single mirror set, as shown in FIG. 3a, a laser beam is moved down by d (5 mm) in the first direction (y-axis), and a beam segment divided by 'd' (5 mm) in the first direction (y-axis) is sent out from the mirror $M_{31}$. By repeating this process, as compared with the raw laser beam traveling into the single mirror set, the beam size is changed from 5 mm (x-axis)×25 mm (y-axis) into 25 mm (x-axis)×5 mm (y-axis), but the beam divergences in the first direction (y-axis) and the second direction (x-axis) are maintained. Further, it is possible to adjust the size of the emitted beam in the first direction (y-axis) by adjusting the space d that is the length of the emission part that corresponds to the movement distance of the beam in the first direction.

Therefore, according to this method, it is possible to reduce the beam divergence in the first direction (y-axis) by moving a laser beam to a predetermined distance in the first direction (y-axis) and then pass a portion of beam at the same height or position.

Further, shifting and dividing of a beam in a single mirror set composed of three mirrors are described in detail with reference to FIGS. 2a and 2b.

Figure 2A:
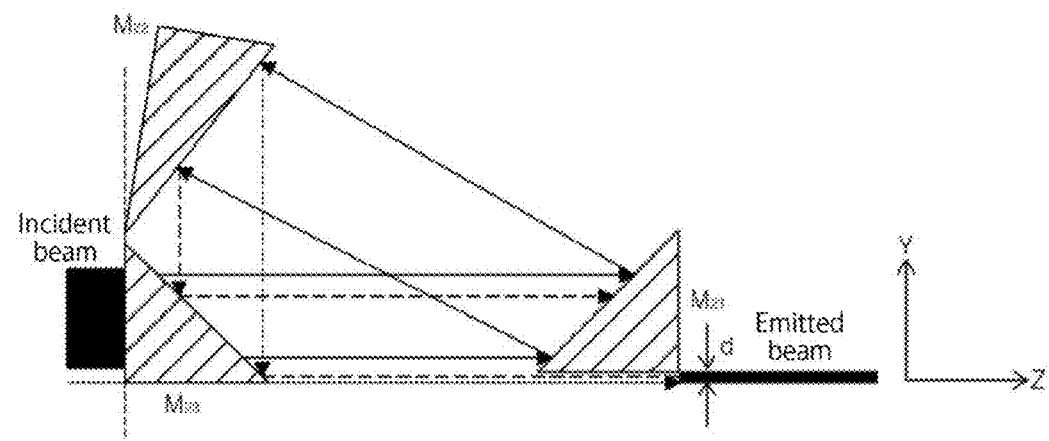
FIG. 2 shows a side view (FIG. 2a) and a plan view (FIG. 2b) showing incidence, reflection, and emission of light in a single mirror set composed of three mirrors according to an embodiment of the present invention.
Figure 2B:
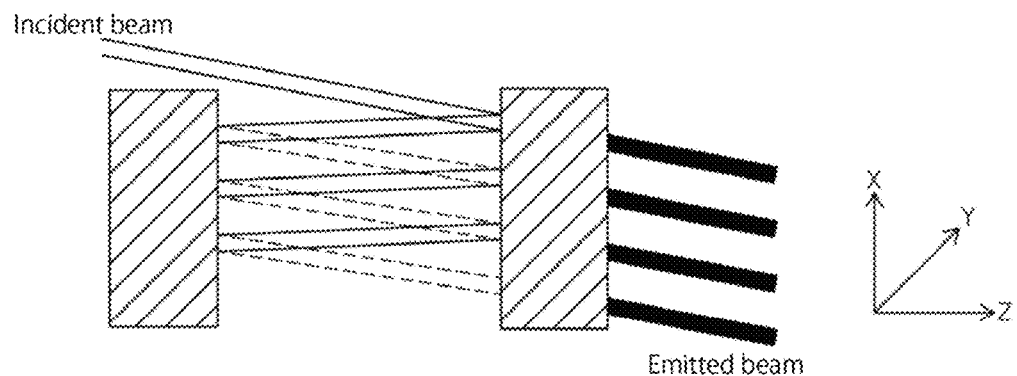

According to the single mirror set $M_{21}$ shown in FIG. 2a, a laser beam is shifted by a distance d in the first direction by repeating a process of sending the laser beam to a mirror $M_{23}$ and then reflecting it by adjusting the position of a mirror $M_{21}$ and the angle of a mirror $M_{22}$. Accordingly, the laser beams passing through the emission part of the mirror $M_{21}$ are sent out in parallel in the same shape as them in the optical system shown in FIGS. 3a and 3b.

Further, it is possible to achieve an optical system that provides the same effect from the single mirror set composed of two mirrors, as shown in FIG. 1a. Referring to FIG. 1, when the mirrors $M_{11}$ and $M_{12}$ are inclined up or down at the same angle and the mirror $M_{12}$ is moved by d under or over the mirror $M_{11}$, the laser beams passing through the emission part of the mirror $M_{11}$ are sent out in parallel in the same shape as them in the optical system shown in FIG. 3.

Figure 4:
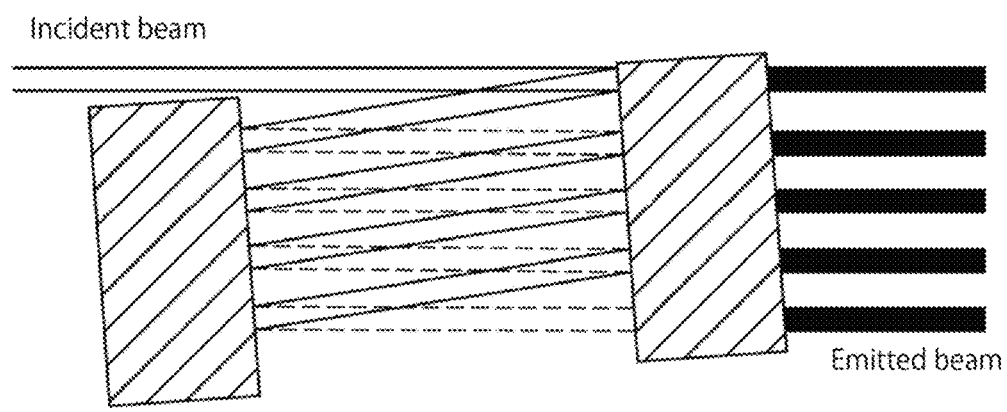
FIG. 4 is a plan view schematically showing incidence, reflection, and emission of light in an optical system including a single mirror set inclined with respect to an optical axis in accordance with an embodiment of the present invention.

Rather than inclining the angle of an incident beam to send the beam to the optical system of a single mirror system, by inclining the optical system of a single mirror set with respect to an incident beam, as shown in FIG. 4, the same effect can be obtained.

A laser beam that has passed through the optical system of the single mirror set described above not only reduces in beam divergence in the first direction (y-axis), but forms a flat-top profile having uniform intensity in the first direction (y-axis).

When a homogenizer is additionally installed behind the single mirror sets in the second direction (x-axis) to transmit the beam segments traveling in the second direction (x-axis), flat-top profiles having uniform intensity are formed in the first direction (y-axis) and the second direction (x-axis). When parallel beams that have passed through the optical system of the single mirror set pass through the homogenizer that is a cylindrical lens array in the second direction (x-axis), they become a line beam having uniform intensity and length suitable for the systems in the second direction. Further, the beams are mixed while traveling only in the second direction (x-axis) and maintain the parallel relationship in the first direction, so a flat-top profile having uniform intensity is formed in the first direction (y-axis) too. This is because the optical system of the single mirror set functions as a cylindrical lens array that mixes beam segments divided in a predetermined size in the first direction (y-axis) at the same height. Further, the beam that has passed through the optical system of the single mirror set is sent out as parallel beam segments, unlike the homogenizer that is a cylindrical lens array, so they do not diverge in the first direction (y-axis).

Figure 7A:
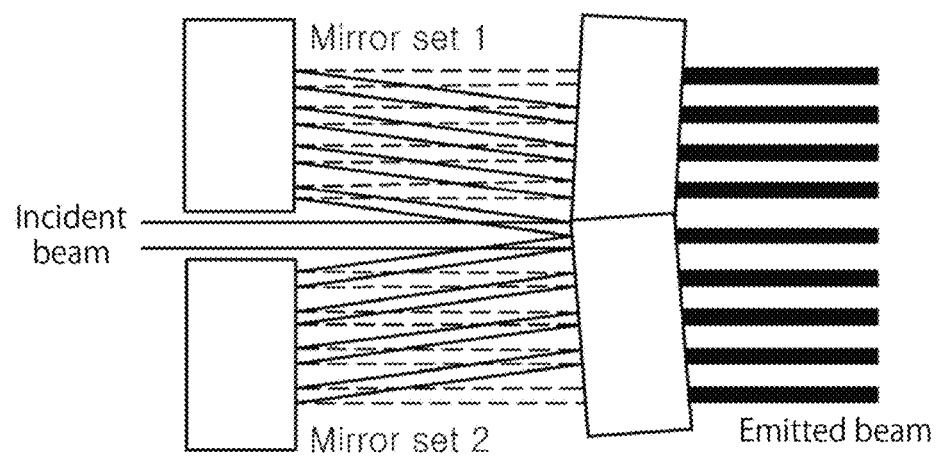
FIG. 7 shows a plan view (FIG. 7a) and a front view (FIG. 7b) showing the configuration of an optical system that transmits an incident beam into two beams using two single mirror sets in accordance with an embodiment of the present invention.
Figure 7B:
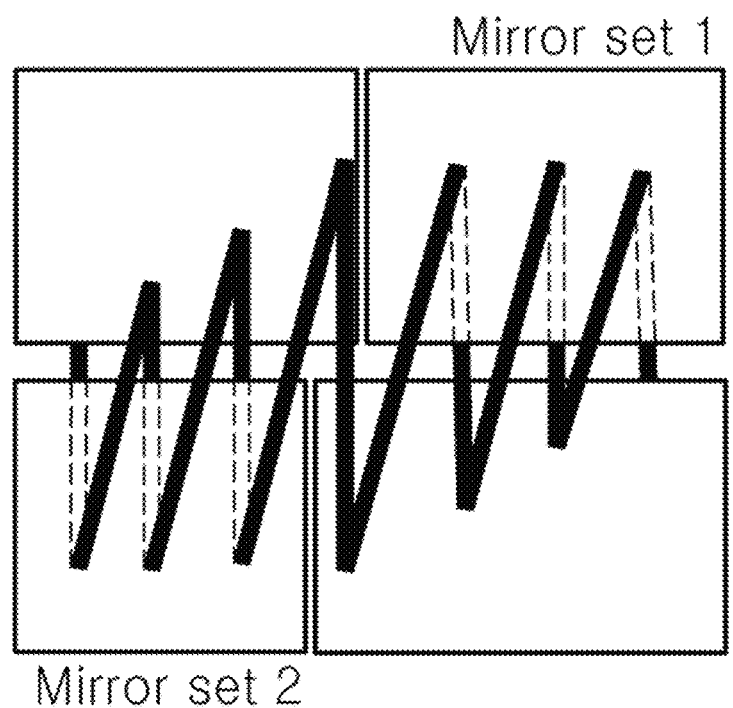

According to an embodiment of the present invention, as shown in FIGS. 7a and 7b, another single mirror set having the same structure as the single mirror set described above is additionally provided, and the additional single mirror set and the single mirror set are arranged at different angle in the opposite directions in the second direction (x-axis) to perform the process of dividing, reflecting again, and sending out an incident beam.

Since the single mirror set and the additional mirror set are inclined at opposite angles in the second direction (x-axis), an incident laser beam is divided into two beams and the two beams travel in opposite directions in the second direction (x-axis). The single mirror set and the additional mirror set move a laser beam in opposite directions in the first direction (y-axis), so laser beam arranged in the second direction (x-axis) are sent out at the same height (at the center of the incident beam) in the first direction (y-axis). According to this method, the number of times of reflection by mirrors is reduced, so a loss of light due to mirror reflectance is reduced. Further, the heights of the incident beam and the emitted beam are the same, so it is easy to arrange laser beams. Accordingly, when an optical system of two single mirror sets facing each other, as shown in FIGS. 1a and 1b, are configured by a single mirror set and an additional mirror set, an optical system composed of four mirrors can be achieved. According to the optical system, the number of reflection by mirrors can be minimized, so a loss of light due to mirror reflectance can be minimized. For example, if mirror reflectance is 99.8% and a laser beam split into halves are each reflected ten times, the loss of light is 2%. Alternatively, if the mirror reflectance is 99.5%, the loss of light is smaller than 5%.

A laser beam passing through the predetermined distance d in the single mirror set described above passes the same height in the first direction (y-axis), as described above, so the size is reduced in the first direction (y-axis), but the divergence is maintained. Further, in the second direction (x-axis), a laser beam is divided into beam segments by being shifted to sides by a predetermined length 'w' by being repeatedly reflected by mirrors, so the length is increased, but the divergence is maintained. When a focusing lens is disposed in the first direction (y-axis), it is similar to the existing optical systems that do not use the single mirror set of the present invention, so it is possible to remarkably reduce a spot size and obtain high-density energy.

Figure 8:
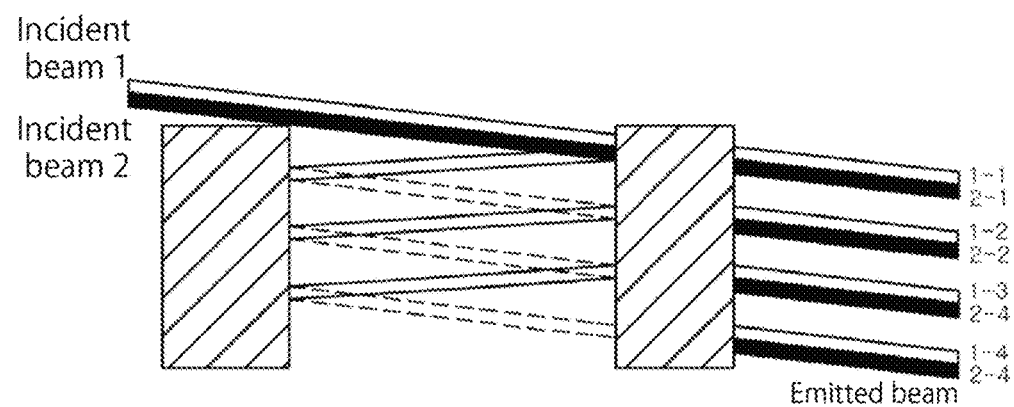
FIG. 8 is a view showing the configuration of an optical system that uses a plurality of adjacent beams as incident beams in accordance with an embodiment of the present invention.

According to another embodiment of the present invention, as shown in FIG. 8, it is possible to send a plurality of adjacent laser beams (an incident laser beam 1 and an incident laser beam 2) to a single mirror set at the same position and angle.

This is for overcoming the limit in the maximum output of a laser when one laser beam is insufficient to process a substance. In the existing optical systems, in order to combine a plurality of laser beams, there is a need for a specific additional optical system, there is a limit in the number of beams that can be combined due to polarization, or a loss of light is caused by absorption or reflection by optical components such as a beam splitter that is disposed ahead of the optical systems to send out laser beams at the same position.

When a plurality of laser beams is combined at different incident angles, the incident angles may depend on NA of a cylindrical lens array. Accordingly, when a plurality of laser beams are simply combined by the method shown in FIG. 8, the laser beams can be combined regardless of the optical characteristics of a cylindrical lens array disposed behind the optical system of a single mirror set. When two or more lasers are radiated adjacent to each other to the optical system of a single mirror set, the laser beams come out of the single mirror set at the same angle at the same position.

According to an embodiment of the present invention, it is possible to adjust laser pulse duration time by adjusting the emission intervals of beam segments by adjusting the distance that a laser beam travels in a single mirror set.

Figure 11:
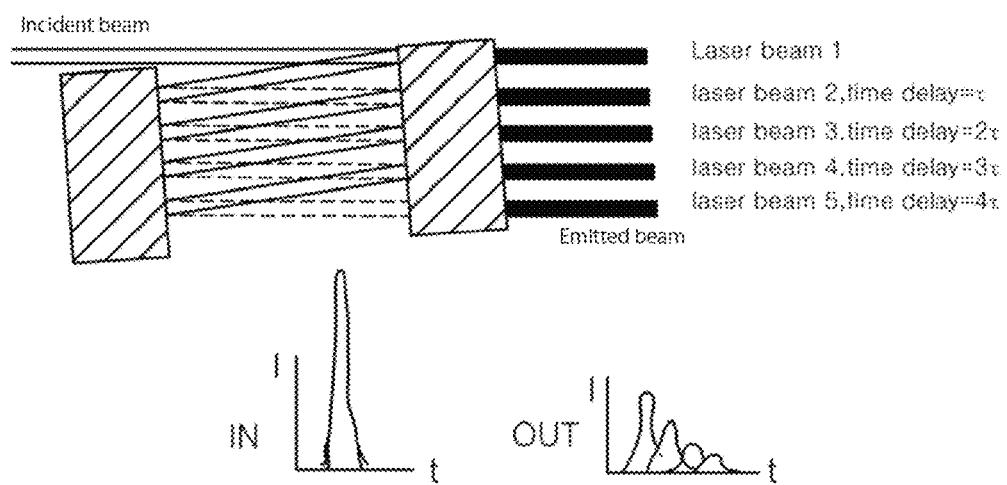
FIG. 11 is a picture illustrating the principle of a laser pulse duration stretcher according to an embodiment of the present invention.

For example, by adjusting the gap between mirrors in the optical system of a single mirror set, as shown in FIG. 11, the laser pulse duration time can be adjusted. The first beam segment 'Laser beam 1' comes out of the optical system of the single mirror set and then the second beam segment 'laser beam 2' is delayed by time 'τ' as much as the reflection length L in the optical system of the single mirror set and then sent out of the optical system of the single mirror set. In the same way, the third beam segment 'laser beam 3' is delayed by time '2τ', the fourth beam segment 'laser beam 4' is delayed by time '3τ', and the fifth beam segment 'laser beam 5' is delayed by time '4τ' and then they are sent out of the single mirror set. The delay times are determined by the reflection length L and the speed of light in the optical system of the single mirror set, $\tau=L/v$. Accordingly, the beam segments delayed and then sent out are mixed by a homogenizer disposed behind the optical system of the single mirror set, so the laser pulse duration time is increased.

In general, short laser pulse duration time is advantageous in a process that requires peak energy (or power) in terms of operation. For this process, the reflection length in the optical system of a single mirror set should be maintained as short as possible. For example, when the reflection length in the optical system of a single mirror set is 30 mm, the delay times of beam segments that come out of the optical system of the single mirror set is not more than 0.1 ns, it is shorter than common raw laser pulse duration time of 15 to 20 ns. Accordingly, when the reflection time in the optical system of a single mirror set is maintained short, it does not influence the laser pulse duration time.

However, in a process in which a substance or an interface is damaged by high peak energy (or power) or a process that requires long laser pulse duration time, a stretcher that increases laser pulse duration time is required. Annealing or lithography of a silicon substrate requires a laser pulse duration stretcher, in which at least 30 ns longer than the raw laser pulse duration time of 15 to 20 ns is required. Accordingly, the reflection distance in the optical system of a single mirror set should be at least 1 m or more. When the distance between mirrors is large and beam divergence is large in the optical system of a single mirror set, a laser beam gradually increases in size while being reflected by the mirrors, so a portion of the laser beam cannot pass through the optical system of the single mirror set and a loss of light is increased.

Accordingly, one or more of a plurality of mirror in the single mirror set may be cylindrical mirror arrays.

Figure 12:
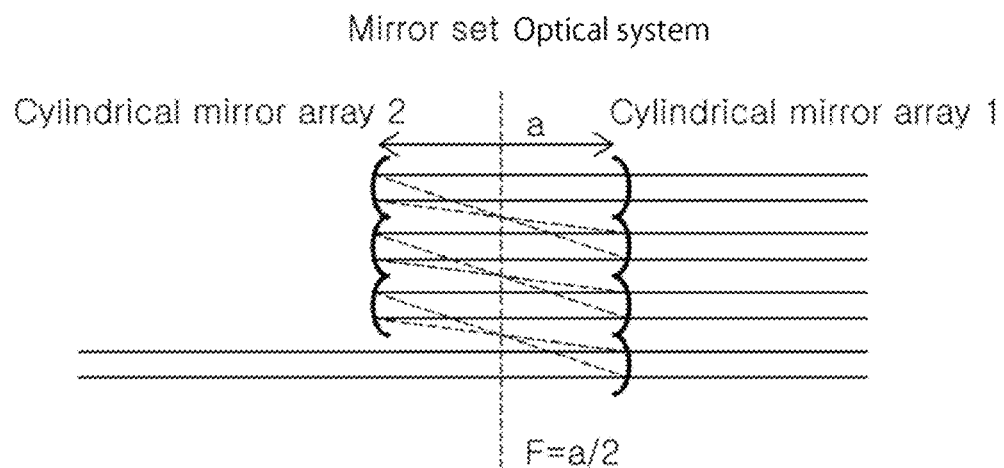
FIG. 12 is a schematic view of a laser pulse duration stretcher using a cylindrical mirror array according to an embodiment of the present invention.

For example, as shown in FIG. 12, when cylindrical mirror arrays are used instead of flat mirrors, it is possible to prevent a laser beam from increasing in size while be reflected in the optical system of the single mirror set. The curvatures of the cylindrical mirror arrays are determined such that the focal distances of the cylindrical mirror arrays are ½ of the length of the optical system of the single mirror set. Parallel incident laser beams are reflected by the cylindrical mirror array 1, focused at the center of the optical system of the single mirror set, and then sent to the cylindrical mirror array 2. The cylindrical mirror arrays 2 reflect the laser beams in parallel to the cylindrical mirror array 1 having the same focal distance and then beam segments of the laser beams are sent out of the single mirror set. The beam segments are mixed by a homogenizer disposed behind the optical system of the single mirror set, so the pulse duration time is also increased.

Accordingly, when the mirrors in a single mirror set are replaced by cylindrical mirror arrays, it is possible to achieve the optical system of a laser pulse duration stretcher.

The beam segments having a predetermined size and coming out of the single mirror set are arranged with regular intervals in the second direction (x-axis). Accordingly, when a second-directional (x-axis) focusing lens (for example, a second-directional (x-axis) cylindrical lens) is positioned ahead of a single mirror set, as shown in FIG. 13, beam segments having a predetermined size and coming out of the single mirror set spreads forward at a predetermined angle.

By additionally disposing a collimation lens in the second direction (x-axis) behind the single mirror set, the beam segments spreading at a predetermined angle can be made parallel beams, so a flat-top profile having uniform intensity can be formed in the second direction (x-axis).

Figure 13:
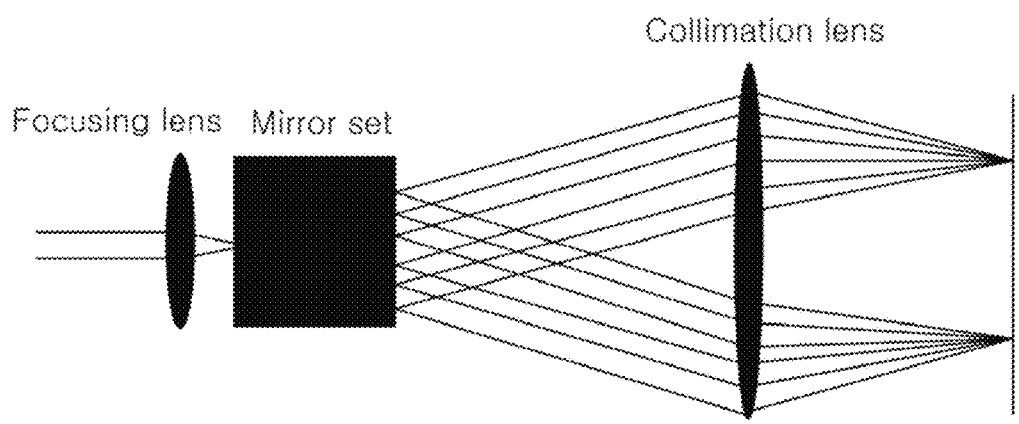
FIG. 13 is a schematic view of an optical system using a single mirror set as a second directional (x-axial) homogenizer according to an embodiment of the present invention.

However, the position where beams concentrated and sent out of a single mirror set, as shown in FIG. 13, start to spread depends on the number of times of reflection in the single mirror set. Accordingly, when a single mirror set is composed of cylindrical mirror arrays, as in FIG. 14a, beams are focused at the same position as at the homogenizer of the cylindrical lens array type and then spread, so the optical system of a second-directional (x-axial) homogenizer can be achieved.

The focal distance of the focusing lens disposed ahead of the optical system of a single mirror set is set to the center of the optical system of the single mirror set. Further, the curvatures of the cylindrical mirror arrays are determined such that the focal distances of the cylindrical mirror arrays are ½ of the length of the optical system of the single mirror set. Accordingly, the beams focused and then spread at the center of the single mirror system by the focusing lens are reflected as parallel beams to the cylindrical mirror array 2 by the cylindrical mirror array 1. The cylindrical mirror array 2 focuses the beams at the center of the optical system of the single mirror set and reflects the beam to the cylindrical mirror array 1 having the same focal distance and then sends beam segments out of the optical system of the single mirror set. The parallel beams reflected and passing through the optical system of a single mirror set in this way are focused and spread at the center of the optical system of the single mirror set, so they form a line beam having uniform luminance in the same way as a homogenizer by cylindrical lens arrays.

Accordingly, Gaussian distribution makes a flat top even in the first direction (y-axis), as described above, so a single mirror set can operate as the optical system of a homogenizer in the first direction (y-axis) and the second direction (x-axis) without a specific homogenizer.

Figure 14A:
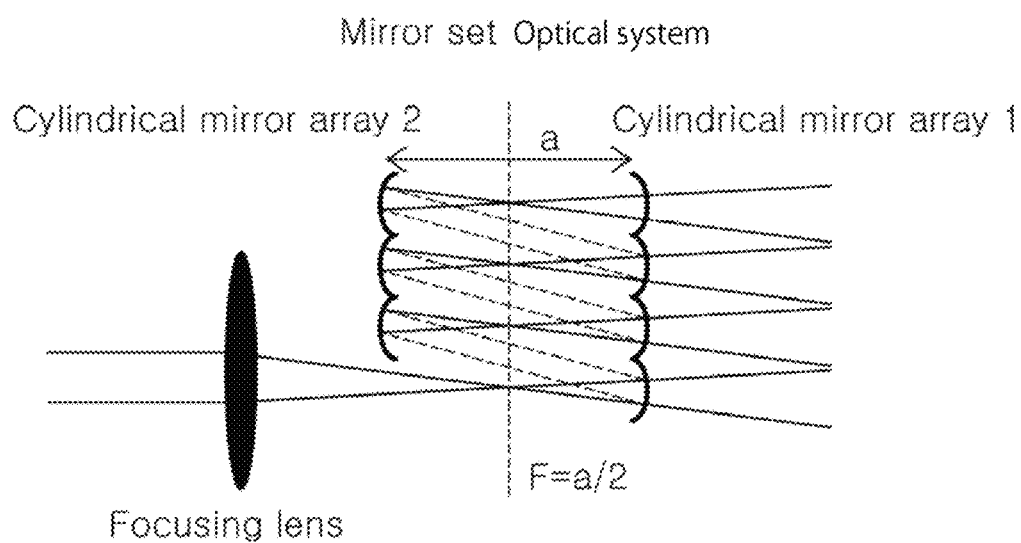
FIGS. 14a, 14b, and 14c show examples of optical systems including cylindrical mirror arrays that are single mirror sets in accordance with an embodiment of the present invention.

FIG. 14a shows an optical system in which two cylindrical mirror arrays have the same focal distances, but the focal distances of the two cylindrical mirror arrays may be made different.

Figure 14B:
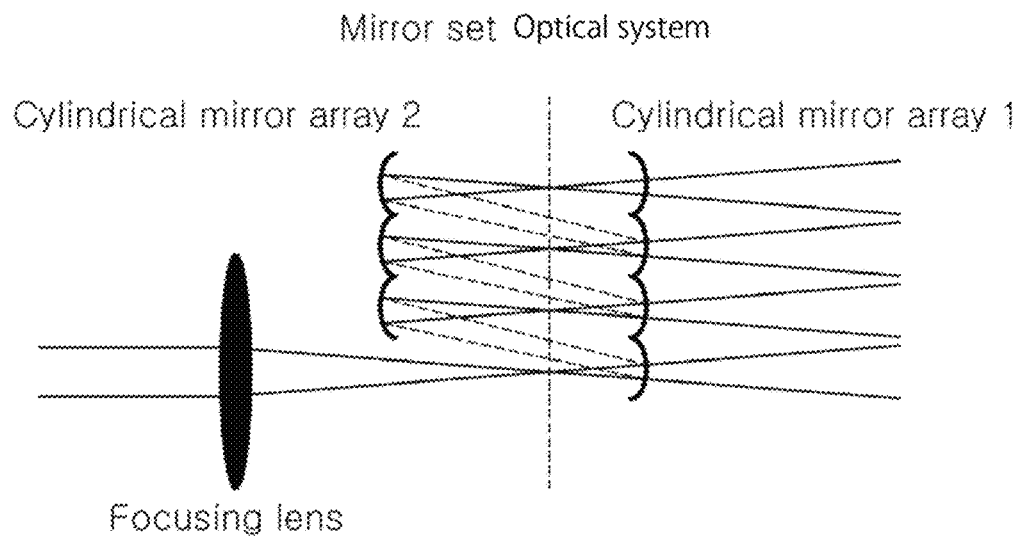

When the focal distances of two cylindrical mirror arrays are made different, as shown in FIG. 14b, the focus that is made by the cylindrical mirror array 2 may be formed not at the center of the optical system of the single mirror set.

Figure 14C:
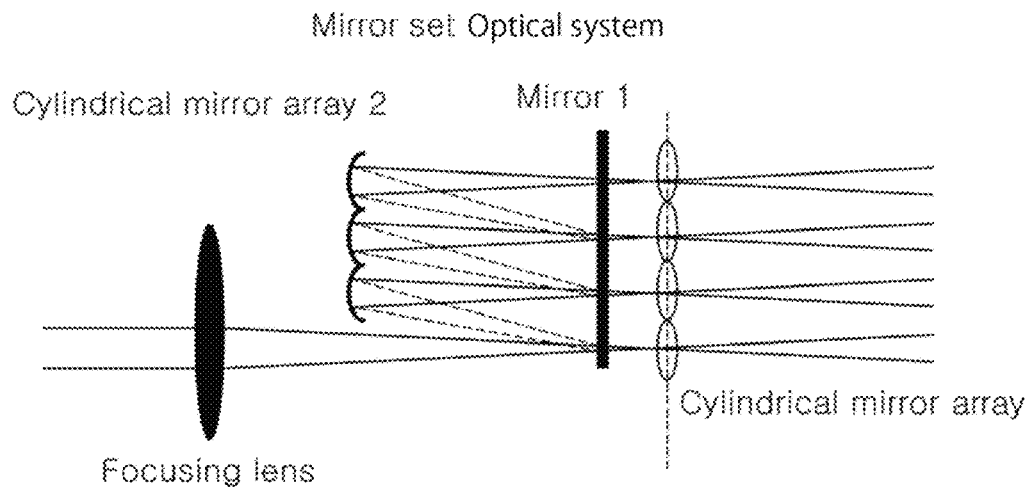

Alternatively, a focus may be formed behind the optical system of a single mirror set due to a predetermined distance from the focal distance of the cylindrical mirror array, as shown in FIG. 14c. In this case, an optical system can be achieved even if using a flat mirror instead of the cylindrical mirror array 1 in FIG. 14b. Even if the cylindrical mirror array and the flat mirror are switched, the effect is the same. This optical system allows for removing one cylindrical mirror array, so it is possible to simply configure an optical system and reduce aberrations due to cylindrical mirror arrays.

The cylindrical lens array disposed behind the optical system of the single mirror set in the second direction (x-axis) is a field lens, which has three functions.

The first one is to increase uniformity of a line beam. The second one is to make beams, which come out of the optical system of a single mirror set after passing through the optical system of a beam converter, parallel beams after a cylindrical lens array. The third one is to adjust the size of a line beam by adjusting the position of a cylindrical lens array.

When a cylindrical lens arrays is positioned ahead of the focus that is made by the cylindrical lens array, the length of a line beam increases over a designed value, and when it is positioned behind the focus, the length of the line beam is reduced under the designed value.

Figure 9:
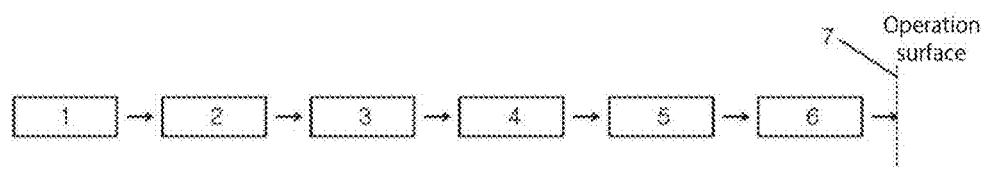
FIG. 9 is a schematic diagram showing the configuration of a line beam forming device according to an embodiment of the present invention.

The line beam forming device including a single mirror set according to the present invention may be composed of five optical systems, as shown in FIG. 9. The device is composed of a relay optical system 2 that moves a raw laser beam from a laser source 1 to a line beam optical system without a change in beam size and beam divergence, a beam shaping optical system that reduces beam divergence in a short axis (y-axis) by increasing the size of the raw laser beam in the first direction (y-axis) before sending the laser beam in to a single mirror set, a single mirror set optical system 4 that reduces the beam length in the first direction (y-axis) while maintaining the reduced beam divergence in the first direction (y-axis), and a homogenizer optical system 5 that makes intensity uniform in the second direction (x-axis) and the first direction (y-axis). Finally, there is a need for a focusing optical system 6 that reduces a spot size by concentrating beams in the first direction (y-axis). The focusing optical system can make a spot size in several to tens of micrometers using one lens or one or more lens groups.

The relay optical system 2 is a telecentric optical system. Using one lens or one lens group makes it possible to obtain images having the same beam size and beam divergence as a raw laser beam at 2F that is double the focal distance of a lens. A double telecentric optical system uses two lenses or two lens groups. The double telecentric optical system is not sensitive to the position of a raw laser beam, so it is useful when the distance between a laser beam and the beam shaping optical system 3 is large.

The beam shaping optical system 3, which changes the size of a beam before the beam travels into the optical system of a single mirror set, makes beam sizes different in the second direction (x-axis) and the first direction (y-axis) generally using a cylindrical lens array.

In the present invention, it is a beam converter, and in order to reduce beam divergence in the first direction (y-axis), it is possible to increase the beam size in the first direction (y-axis), and maintain or change the length in the second direction (x-axis) so that a beam can easily pass through the single mirror set optical system 4.

The single mirror set optical system 4, as described above, can reduce the length and beam divergence in the first direction (y-axis), combine a plurality of laser beams, and make a flat-top profile for uniform intensity in the first direction (y-axis).

There is a need for an optical system that makes the intensity of a laser, which has passed through the single mirror set optical system 4, uniform in the second direction (x-axis). To this end, the homogenizer optical system 5 can be used. The homogenizer optical system 5 may be composed of a cylindrical lens array and a collimation lens in the second direction (x-axis).

Laser beams divided by the cylindrical lens array are combined into a desired length through the collimation lens, thereby making a line beam having a uniform intensity.

Finally, the focusing optical lens 6 is composed of one lens or one or more lens groups and condenses or reduces a spot size into several to tens of micrometers. When the laser beam of a flat-top profile that has passed through the single mirror optical system 4 and the homogenizer 5 is condensed through a lens, an intensity profile of a sinc function is obtained on a focal surface. The intensity profile of a sinc function is similar to Gaussian profile, so it is useful for a substance or an interface having a high damage threshold. However, a flat-top profile is needed on a processed surface, depending on the laser processing type. Accordingly, when a reducing imaging optical system is applied to the laser beam of a flat-top profile that has passed through the optical mirror set optical system, a line beam of several to tens of micrometers of flat-top profile can be made on the imaging surface.

Figure 10A:
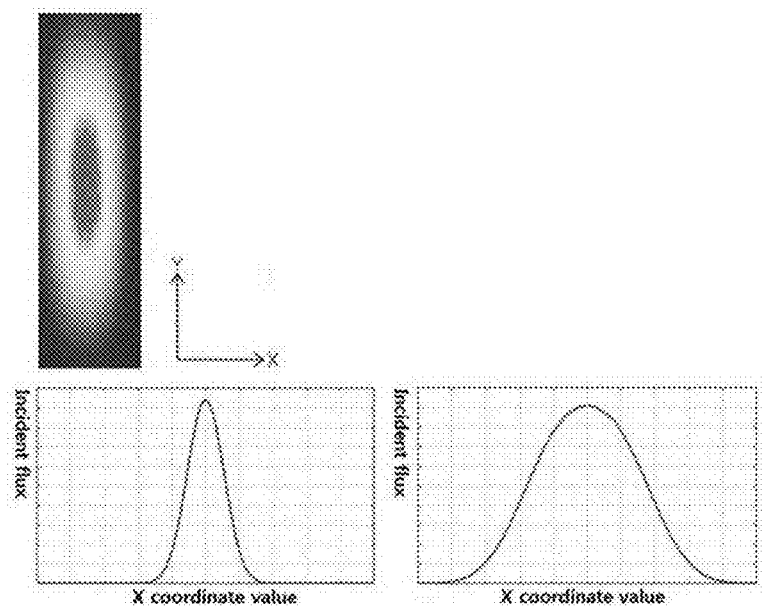
FIG. 10 shows beam profiles after the size of the beam is increased in a first direction (y-axis) (FIG. 10a) and then the beam passes through a single mirror set (FIG. 10b).
Figure 10B:
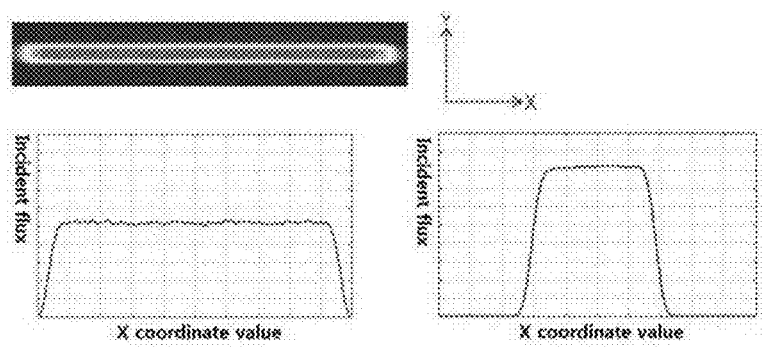

FIG. 10 shows a simulation result of the optical systems. It can be seen from the figures that the laser beam (FIG. 10a) that has passed through the beam shaping optical system shows Gaussian intensity profile in the first direction (y-axis) and the second direction (x-axis), but the laser beam (FIG. 10b) that has passed through the single mirror set optical system and the cylindrical lens array shows a flat-top intensity profile not only in the second direction (x-axis), but in the first direction (y-axis).

INDUSTRIAL APPLICABILITY

As described above, the line beam forming device including a single mirror set of the present invention can be provided as an optical system that may use one laser or may simply combine a plurality of lasers. Further, the device can operate as a homogenizer that makes a flat-top profile in the direction of a short axis (y-axis) of a laser beam. Further, the device can send out beam segments having a predetermined size while moving a beam to a predetermined distance in the direction of the short axis (y-axis) through a process of repeatedly reflecting the beam in the single mirror set and sequentially sending out beam segments, and arrange the beam segments with regular intervals in the direction of a long axis (x-axis). Further, it is possible to ensure a high-density energy beam by reducing a beam divergence in the direction of a short axis (y-axis) by increasing the length and reducing the beam divergence in the direction of the short axis (y-axis) through a beam converter disposed ahead of the single mirror set and then sending the beam into single mirror set. Further, it is possible to achieve a flat-top profile in both of the directions of the long axis (x-axis) and the short axis (y-axis) by additionally providing a cylindrical lens array or a homogenizer similar to the cylindrical lens array in the direction of the long axis (x-axis), so the device is expected to be used in various fields.

The invention claimed is:

1. A line beam forming device that forms a line beam on an operation surface, the device comprising:
   a laser source emitting a laser beam; and
   a single mirror set composed of a plurality of mirrors,
   wherein a single mirror set is disposed in the beam forming device to sequentially emit beam segments having a predetermined size by repeating a process of receiving a laser beam, emitting beam segments having a predetermined size by dividing the laser beam in a first direction (y-axis) perpendicular to a traveling direction (z-axis) of the laser beam, and moving the other beam by a predetermined size in the first direction (y-axis) by reflecting again the other beam in the single mirror set, and to arrange the beam segments with regular intervals in a second direction (x-axis) perpendicular to the traveling direction (z-axis) of the laser beam.

2. The device of claim 1, further comprising a beam converter ahead of the single mirror set,
   wherein a beam divergence in the first direction (y-axis) is reduced by increasing a size of the laser beam in the first direction (y-axis) through the beam converter and then the converted laser beam is sent into the single mirror set.

3. The device of claim 1, wherein the single mirror set includes a first mirror receiving the incident laser beam, emitting a beam segment through an emission part, and reflecting the other beam and a second mirror receiving and reflecting again the beam reflected by the first mirror, and
   the first mirror is spaced from the second mirror in the traveling direction (z-axis) of the laser beam and disposed at a different position by a length (d) of the emission part in the first direction (y-axis).

4. The device of claim 3, wherein a length of the beam segment in the first direction (y-axis) is adjusted by adjusting the length (d) of the emission part.

5. The device of claim 3, wherein the emission part is a space filled with air.

6. The device of claim 3, wherein the emission part extends from the first mirror and is coated with an anti-reflective layer.

7. The device of claim 6, wherein a refraction correction member is additionally disposed in an emission path of the beam segment, and
   the refraction correction member is made of the same material with the same thickness as the emission part coated with the anti-reflective layer, and is inclined at an opposite angle to the emission part.

8. The device of claim 3, wherein the beam reflected by the first mirror is directly sent to the second mirror and then reflected back to the first mirror, or is sent to the second mirror through one additional mirror disposed in the single mirror set and then reflected back to the first mirror.

9. The device of claim 1, wherein gaps between the beam segments in the second direction (x-axis) and the total length of an emitted beam in the second direction (x-axis) are adjusted by adjusting an incident angle of the laser beam in the second direction (x-axis) or an assembly angle of the single mirror set.

10. The device of claim 1, wherein the laser beam travels at an angle, excluding a right angle, to the mirrors of the single mirror set in the second direction (x-axis).

11. The device of claim 1, further comprising an additional single mirror set having the same structure of the single mirror set,
   wherein the single mirror set and the additional single mirror set are disposed at opposite angles to each other in the second direction (x-axis), divide an incident beam into halves, and respectively reflect and emit the beams.

12. The device of claim 1, further comprising a homogenizer behind the single mirror set in the second direction (x-axis),
   wherein a flat-top profile having uniform beam intensity is formed in the first direction (y-axis) and the second direction (x-axis) by sending beam segments arranged in the second direction (x-axis) through the homogenizer.

13. The device of claim 1, wherein the laser beam traveling in to the single mirror set is composed of a plurality of adjacent beams and the adjacent beams travel into the single mirror set at the same position at the same angle.

14. The device of claim 1, wherein laser pulse duration time is adjusted by adjusting emission intervals of the beam segments by adjusting a distance that a beam travels in the single mirror set.

15. The device of claim 1, wherein one or more of the mirrors of the single mirror set are cylindrical mirror arrays.

16. The device of claim 15, further comprising a focusing lens ahead of the single mirror set in the second direction (x-axis) to spread emitted beam segments at a predetermined angle.

17. The device of claim 16, further comprising a collimation lens behind the single mirror set in the second direction (x-axis) to form a flat-top profile having uniform beam intensity in the first direction by making the beam segments, which are spread and emitted at a predetermined angle, parallel beams having the same length.

* * * * *